(12) United States Patent
Han et al.

(10) Patent No.: US 7,688,155 B2
(45) Date of Patent: Mar. 30, 2010

(54) VARIABLE CAPACITOR CIRCUIT HAVING LINEAR CAPACITANCE VARIATION AND VOLTAGE CONTROLLED OSCILLATOR USING THE SAME

(75) Inventors: Seon-Ho Han, Daejon (KR); Cheon-Soo Kim, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 148 days.

(21) Appl. No.: 11/645,893

(22) Filed: Dec. 27, 2006

(65) Prior Publication Data

US 2008/0042771 A1 Feb. 21, 2008

(30) Foreign Application Priority Data

Jul. 31, 2006 (KR) .................. 10-2006-0072412

(51) Int. Cl.
H03B 5/18 (2006.01)
(52) U.S. Cl. .................. 331/177 V; 331/36 C; 331/167
(58) Field of Classification Search ............... 331/36 C, 331/167, 177 V
See application file for complete search history.

(56) References Cited

U.S. PATENT DOCUMENTS

| 6,653,716 | B1 | 11/2003 | Vashchenko et al. |
| 6,985,044 | B2 | 1/2006 | Gomez et al. |
| 7,009,472 | B2 | 3/2006 | Lai |
| 7,209,016 | B2 * | 4/2007 | Perry et al. ............. 331/177 V |
| 2005/0111605 | A1 | 5/2005 | Loke et al. |

FOREIGN PATENT DOCUMENTS

| JP | 2005-005801 | 1/2005 |
| KR | 1019950028300 A | 10/1995 |
| KR | 1019960027344 A | 7/1996 |
| KR | 1019980018300 A | 6/1998 |
| KR | 1020010058281 A | 7/2001 |
| KR | 1020030001044 A | 1/2003 |

OTHER PUBLICATIONS

Svelto, F., et al., "A 1.3GHz CMOS VCO with 28% frequency tuning." 1999. IEEE 1999 Custom Integrated Circuits Conference.
Ming Yip Wong, W., et al., "A Wide Tuning Range Gated Varactor." May 2000. *IEEE Journal of Solid State Circuits*, vol. 35, No. 5, pp. 773-779.
Andreani, P., et al. "On the Use of MOS Varactors in RF VCO's." Jun. 2000. *IEEE Journal of Solid State Circuits*, vol. 35, No. 6, pp. 905-910.

* cited by examiner

*Primary Examiner*—Robert Pascal
*Assistant Examiner*—James E Goodley
(74) *Attorney, Agent, or Firm*—Ladas & Parry LLP

(57) ABSTRACT

Provided is an apparatus having a variable capacitor circuit which is capable of obtaining a constant gain with respect to a whole control voltage by using a linear variable frequency characteristic for a variation of the control voltages, to thereby attain a wide variable frequency range. For this, a variable capacitor circuit includes a plurality of variable capacitors being connected in parallel with each other and having different capacitances with respect to an input control voltage, wherein the sum of the variable capacitances of the plurality of variable capacitors at a same voltage level of the control voltage varied within the whole control voltage range has linearity.

9 Claims, 3 Drawing Sheets

VARIABLE CAPACITOR CIRCUIT HAVING LINEAR CAPACITANCE VARIATION AND VOLTAGE CONTROLLED OSCILLATOR USING THE SAME

FIELD OF THE INVENTION

The present invention relates to a semiconductor design technique; and, more particularly, to a variable capacitor circuit and a voltage controlled oscillator using the same for varying an oscillation frequency by controlling a capacitance with respect to an input voltage.

DESCRIPTION OF RELATED ART

With the sharp increase of the demand for an industrial communication network and an emergency communication network and the abrupt spread of a mobile communication service in recent years, the development of various mobile communication systems such as next-generation paging, digital cellular and Personal Communication Service (PCS) has been accelerated.

In a mobile communication terminal, a VCO for generating a transmitting/receiving frequency for a carrier is a very important core device. An output level, phase noise and harmonic characteristic of a signal generated by the VCO directly determine system sensitivity and operating characteristics. This VCO has been steadily improved in size and characteristic.

In general, the VCO is a circuit for generating an output signal having a certain frequency with respect to a control voltage, and includes an LC resonant circuit composed of an inductor and a capacitor and an oscillation circuit having an active device for compensating for energy loss occurred in an abnormal LC resonant circuit.

FIG. 1 is a configuration diagram provided to explain a configuration and operation of a conventional VCO.

Referring to FIG. 1, the conventional VCO includes an LC resonant circuit 10 composed of an inductor L and a variable capacitor Var (hereinafter, referred to as 'varactor'), and an oscillation circuit 20 composed of an active device (not shown) such as a transistor.

More specifically, the LC resonant circuit 10 includes the varactor Var connected in series between a control voltage input terminal 1 to which a control voltage Vc is inputted and the oscillation circuit 20, and the inductor L connected in parallel with the varactor Var between a node to which the oscillation circuit 20 and the varactor Var are connected and a ground voltage source.

On the other hand, the control voltage Vc inputted to the control voltage input terminal 1 has a DC component. For example, when the VCO shown in FIG. 1 is used for a Phase Locked Loop (PLL), the control voltage Vc is supplied from a loop filter. In addition, when the VCO shown in FIG. 1 is applied to a mobile communication terminal, the inductor L is generally implemented by using a micro-strip line, instead of using a chip inductor, in order to stabilize a resonance characteristic by improving Q (quality factor) on which the resonance characteristic depends.

The operating characteristic of the conventional VCO depicted in FIG. 1 will now be explained.

In the VCO shown in FIG. 1, a resonant frequency of the LC resonant circuit 10 is determined by a capacitance of the varactor Var and an inductance of the inductor L. If the capacitance is varied by the capacitance control voltage Vc of the varactor Var according to an input voltage, the resonant frequency is varied, and thus, an oscillation frequency oscillated by the oscillation circuit 20 is varied. As a result, the VCO operation in which the oscillation frequency is varied by the control voltage Vc is performed.

As described above, the varactor Var is the important factor of determining the oscillation frequency of the VCO.

The varactor has been widely used in a control circuit or an oscillator. For example, a radio frequency oscillator employs the varactor to adjust an oscillation frequency to a specific value. An oscillation frequency of an LC oscillator which is one of the radio frequency oscillators is represented as:

$$\omega_o = 1/\sqrt{LC} \qquad \text{Eq. (1)}$$

Accordingly, the LC oscillator using the varactor can adjust the frequency by varying the capacitance C of the varactor, thereby making it possible to broadly control the frequency.

This varactor is manufactured by a Complementary Metal Oxide Semiconductor (CMOS) manufacturing process, and uses a voltage dependent characteristic of a PN junction diode or a MOS capacitor. The varactor using the voltage dependent characteristic of the MOS capacitor is called a MOS varactor.

Normally, the MOS varactor has a configuration as shown in FIG. 2. As illustrated in FIG. 2, the MOS varactor is provided with two terminals of a silicon well. This MOS varactor can vary an effective capacitance by changing a bias voltage applied to an N-well, namely, a control voltage.

FIG. 3 is a graph showing a characteristic of the MOS varactor depicted FIG. 2. The MOS varactor shows a capacitance variation within a certain control voltage range, as in FIG. 3. That is, the MOS varactor is nonlinear in a variation of the control voltage. A control voltage having a capacitance Ccen of an intermediate value (between a maximum value Cmax and a minimum value Cmin of the capacitance) exists around the middle of the variable control voltage range. Therefore, when the MOS varactor having such a characteristic is used in an oscillator, a gain of the oscillator defined as a ratio of a frequency variation to a control voltage is remarkably varied within the whole control voltage range. Here, the gain of the oscillator is determined as follows:

$$K_{VCO} = \Delta f_{VCO}/\Delta V \qquad \text{Eq. (2)}$$

The oscillator is configured in a negative feedback loop of a PLL to output a precise frequency. In this configuration, the gain variation of the VCO results in the characteristic variation of the whole negative feedback loop. Namely, an output phase noise is varied by the gain variation of the whole negative feedback loop.

As mentioned above, in the conventional VCO having the varactor, the gain of the oscillator defined as the ratio of the frequency variation to the control voltage is considerably varied within the whole control voltage range. Accordingly, a wide variable frequency range cannot be obtained and an output phase noise is greatly varied, thus making it impossible to obtain a constant VCO operating characteristic.

SUMMARY OF THE INVENTION

It is, therefore, a primary object of the present invention to provide an apparatus having a variable capacitor circuit which is capable of obtaining a constant gain with respect to a whole control voltage by using a linear variable frequency characteristic with respect to a variation of the control voltage, to thereby attain a wide variable frequency range.

In accordance with an embodiment of the present invention, there is provided a variable capacitor circuit, including: a plurality of variable capacitors being connected in parallel with each other and having different capacitances with respect to an input control voltage, wherein the sum of the variable capacitances of the plurality of variable capacitors at a same voltage level of the control voltage varied within the whole control voltage range has linearity.

In accordance with another embodiment of the present invention, there is provided a voltage controlled oscillator including: a plurality of variable capacitors being connected in parallel with each other and having different capacitances with respect to an input control voltage; and an inductor connected in parallel with the variable capacitor circuit, wherein the sum of the variable capacitances of the plurality of variable capacitors at a same voltage level of the control voltage varied within the whole control voltage range has linearity.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Figure 1:
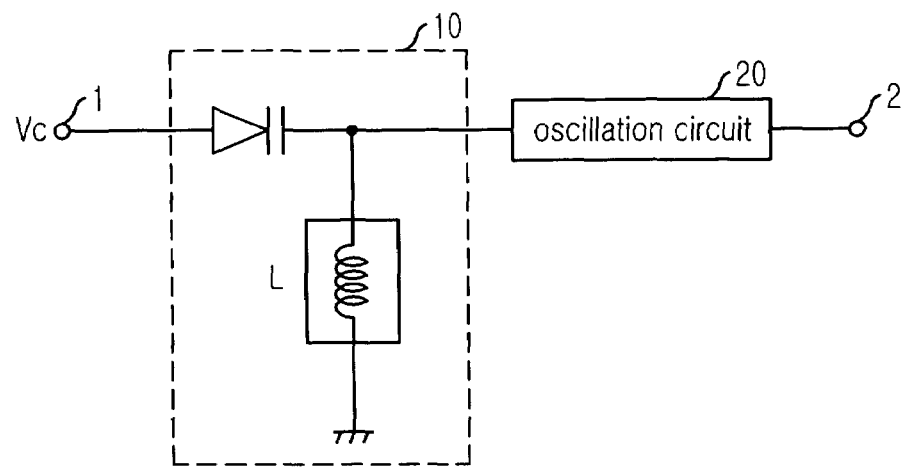
FIG. 1 is a circuit diagram illustrating a configuration of a conventional VCO.
Figure 2:
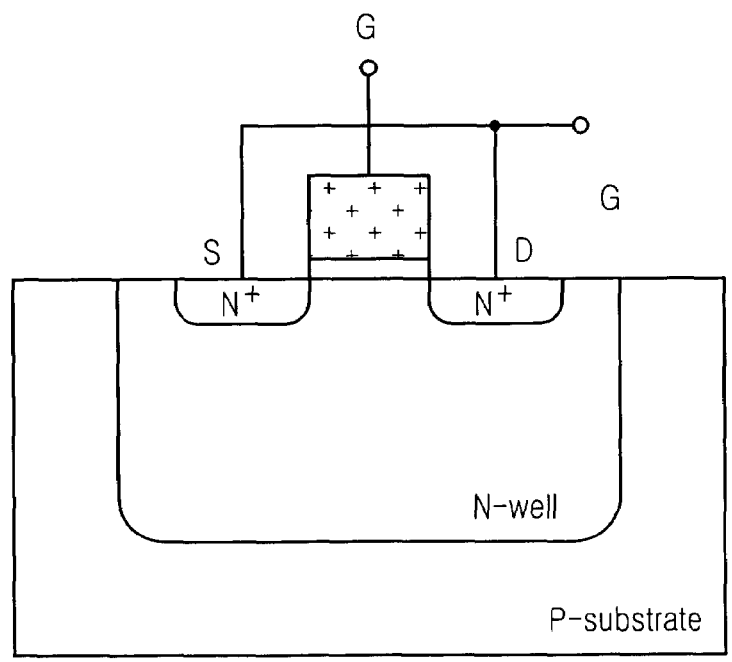
FIG. 2 is a cross-sectional view illustrating a structure of a MOS varactor which is one example of the varactor shown in FIG. 1.

Hereinafter, a preferred embodiment of the present invention will be set forth in detail with reference to the accompanying drawings to the extent that a person skilled in the art can easily carry out the invention. Further, in the following description, like reference numerals denote like elements throughout the specification of the present invention.

Embodiments

Figure 4:
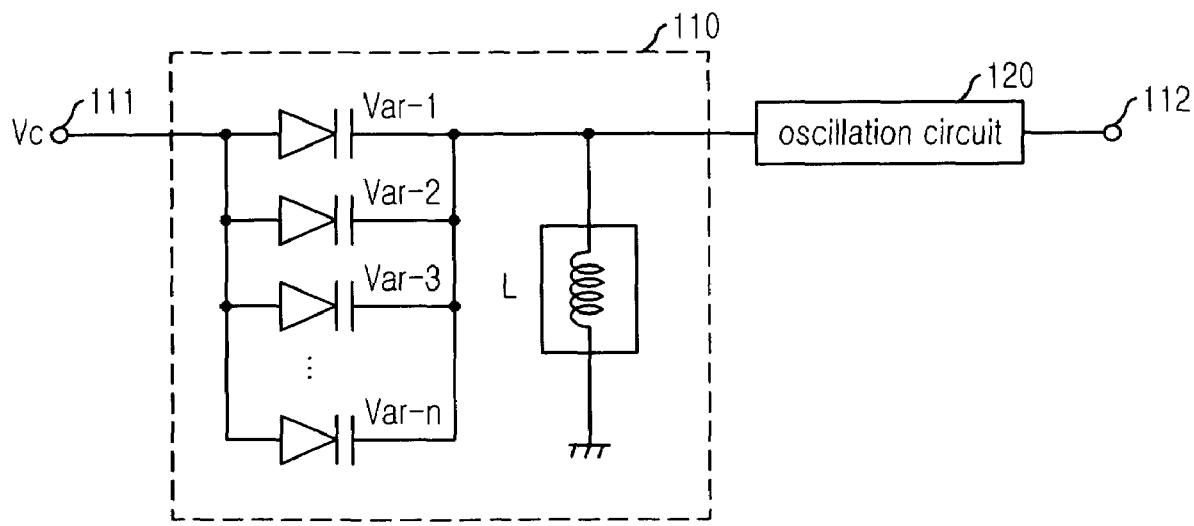
FIG. 4 is a circuit diagram illustrating a configuration of a VCO in accordance with a preferred embodiment of the present invention.

FIG. 4 is a circuit diagram provided to explain a configuration of a VCO in accordance with a preferred embodiment of the present invention.

Referring to FIG. 4, the VCO of the present invention includes an LC resonant circuit 110 having an inductor L and a plurality of varactors Var-1, Var-2, Var-3, . . . , Var-n connected in parallel with each other, and an oscillation circuit 120 for amplifying a resonant frequency of the LC resonant circuit 110 to generate an oscillation frequency.

The plurality of varactors Var-1, Var-2, Var-3, . . . , Var-n are connected in parallel between a control voltage input terminal 111 and the oscillation circuit 120, and have different capacitances with respect to a same control voltage Vc to have a linear variable frequency characteristic with respect to a variation of the control voltage Vc.

Now, the plurality of varactors Var-1, Var-2, Var-3, . . . , Var-n will be explained in detail with reference to FIG. 5.

Figure 5:
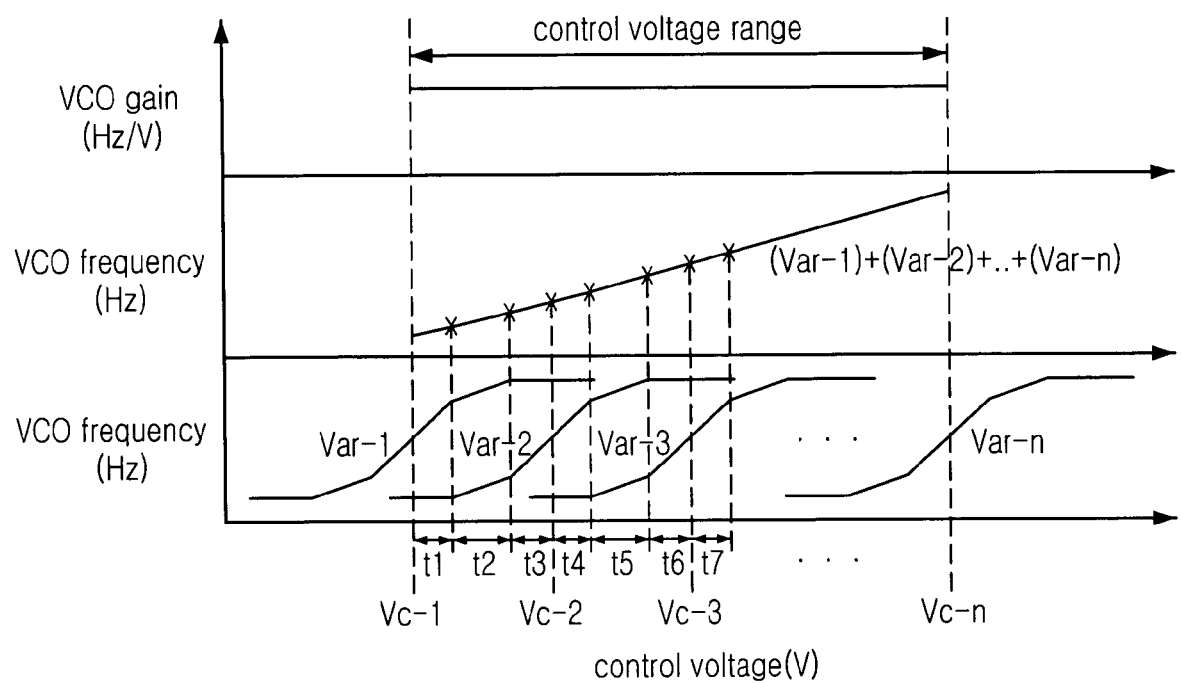
FIG. 5 is a graph showing an operating characteristic of the VCO provided in FIG. 4.

As shown in FIG. 5, the plurality of varactors Var-1, Var-2, Var-3, . . . , Var-n are manufactured to have different capacitances with respect to the control voltage varied within the whole control voltage range of Vc-1 to Vc-n, thereby acquiring a linear VCO frequency and a constant VCO gain. For this, as one example, each of the varactors Var-1, Var-2, Var-3, . . . , Var-n is manufactured in a manner that the control voltage generating a capacitance of an intermediate value has a different voltage level within the whole control voltage range. For example, the varactors are manufactured in such a way that the varactor Var-1 has the capacitance of the intermediate value in the control voltage Vc-1, the varactor Var-2 has the capacitance of the intermediate value in the control voltage Vc-2, the varactor Var-3 has the capacitance of the intermediate value in the control voltage Vc-3, and the varactor Var-n has the capacitance of the intermediate value in the control voltage Vc-n. Here, the levels of the control voltage should satisfy Vc-1<Vc-2<Vc-3< . . . <Vc-n.

The VCO frequency shown in FIG. 5 will be explained below in more detail in sections.

t1 Section

First, the control voltage in t1 section is denoted by Vc_t1. Then, it is assumed that the voltage relationship satisfies Vc-1<Vc_t1, and the variable capacitance of the varactor Var-1 linearly increases in the t1 section. In the t1 section satisfying the above condition, the frequency of the VCO is determined by the sum of the capacitances of the varactors Var-1 and Var-2. The varactor Var-2 is manufactured such that it has a capacitance of a constant value (minimum value) at the Vc_t1 voltage level. Therefore, in the t1 section, the frequency of the VCO is actually determined by the variable capacitance of the varactor Var-1.

t2 Section

First, the control voltage in t2 section is denoted by Vc_t2. Then, it is assumed that the voltage relationship satisfies Vc_t1<Vc_t2 and the variable capacitances of the varactors Var-1 and Var-2 nonlinearly increase in the t2 section. In the t2 section satisfying the above condition, the frequency of the VCO is determined by the sum of the capacitances of the varactors Var-1 and Var-2. As compared with the t1 section, the capacitance of the varactor Var-1 is nonlinearly varied, thereby reducing an increase rate thereof. The increase rate of the capacitance lower than that of the t1 section as above is compensated by the capacitance of the varactor Var-2.

For better understanding, when the increase rate of the variable capacitance of the varactor Var-1 in the t1 section is '1', and the increase rates of the variable capacitances of the varactors Var-1 and Var-2 in the t2 section are '0.5' respectively, a total increase rate of the variable capacitances in the t2 section is '1(0.5+0.5)'. As a result, the linearity of the variable capacitance can be maintained in the t2 section, as in the t1 section.

t3 Section

First, the control voltage in t3 section is denoted by Vc_t3. Then, it is assumed that the voltage relationship satisfies 'Vc-2<Vc_t3=Vc-2', the varactor Var-1 has a capacitance of a constant value (maximum value), and the variable capacitance of the varactor Var-2 linearly increases in the t3 section. In the t3 section satisfying the above condition, the frequency of the VCO is determined by the sum of the capacitances of the varactors Var-1 and Var-2. Here, the varactor Var-1 is manufactured such that it has a capacitance of a constant value (maximum value) at Vc_t3 voltage level. Therefore, an increase rate of the capacitance is '0'. However, an increase rate of the variable capacitance of the varactor Var-2 is '1', which has linearity. Therefore, the increase rate of the variable capacitances in the t3 section is actually '1', so that the linearity is maintained. As a result, the VCO frequency in the t3 section has linearity.

As described above, the VCO frequency continuously has linearity in the t1 to t3 sections. Although not explained, the VCO frequency also maintains linearity in t4 to t7 sections.

In order to obtain the VCO frequency with continuous linearity by connecting the plurality of varactors Var-1, Var-2, Var-3, . . . , Var-n in parallel, the variations of the variable capacitances between the varactors Var-1, Var-2, Var-3, . . . , Var-n with respect to the control voltage Vc should be taken into consideration.

Figure 3:
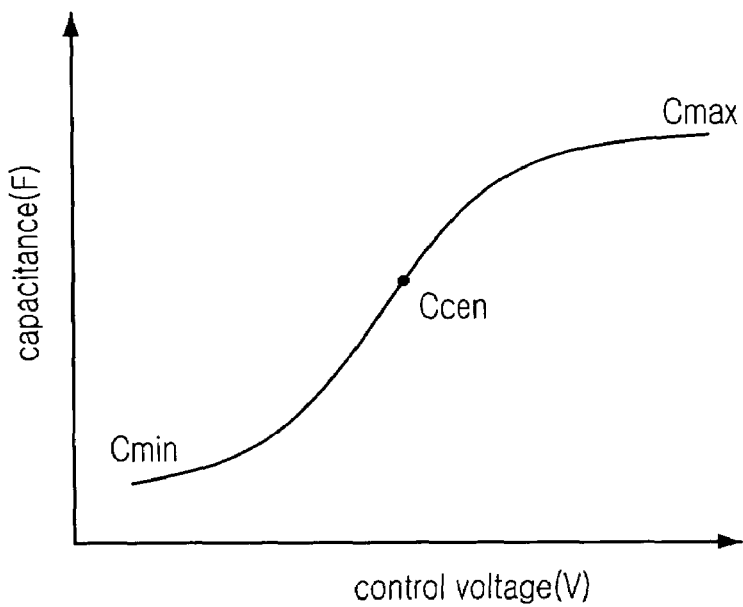
FIG. 3 is a graph showing a characteristic of the MOS varactor depicted in FIG. 2.

As explained in detail through the t1 to t3 sections shown in FIG. 5, the varactors Var-1, Var-2, Var-3, . . . , Var-n have the same variable capacitance characteristics (see FIG. 3), but should have different variable capacitances with respect to the same control voltage Vc. That is, the varactors must be manufactured such that the variable capacitance characteristic of the varactor Var-1 with respect to the control voltage Vc varied in the t1 to t4 sections is identical to that of the varactor Var-2 with respect to the control voltage Vc varied in the t4 to t7 sections, wherein since the capacitance is constantly maintained at a maximum value after t4 section, it will not be described here.

For example, when the control voltage Vc is 0 to 1V in the t1 section, 1 to 2V in the t2 section, and 2 to 3V in the t3 section, if the varactor Var-1 was manufactured such that its capacitance is 0 to 1 F in the t1 section, 1 to 1.5 F in the t2 section, and 1.5 F in the t3 section, the varactor Var-2 must be manufactured such that it capacitance is 0 F in the t1 section, 0 to 0.5 F in the t2 section, and 0.5 to 1.5 F in the t3 section. As a result, the varactors Var-1, Var-2, Var-3, . . . , Var-n are manufactured so that the increase rates of the variable capacitances in each section can be '1', namely, have linearity.

As mentioned above, the method of diversifying the variable capacitance characteristics of the varactors Var-1, Var-2, Var-3, . . . , Var-n with respect to the variation of the control voltage Vc can be embodied by a manufacturing process. One example is a method of controlling a substrate or channel doping concentration. In other words, different variable capacitance characteristics can be embodied with respect to the variation of the control voltage Vc by applying different process conditions to the varactors Var-1, Var-2, Var-3, . . . , Var-n, respectively.

Meanwhile, only the MOS varactor has been illustrated in the above embodiment. However, the present invention is also applicable to a junction varactor. The junction varactor and the MOS varactor can vary the frequency within the control voltage range according to an applied manufacturing process, thereby making it possible to vary the frequency in a remarkably broad range. Even if the variable 'n' used in FIGS. 4 and 5 is about 2 to 3 only, the linear variable frequency characteristic can be attained.

As discussed earlier, the present invention has the following advantages.

First, in accordance with the present invention, a plurality of varactors having different capacitances with respect to a control voltage within the whole control voltage range are connected in parallel to implement a variable capacitor circuit, thereby obtaining a variable capacitance having linearity within the whole control voltage range.

Second, in accordance with the present invention, the variable capacitor circuit having linearity can be applied to a resonant circuit, thereby obtaining a resonant frequency having linearity within the whole control voltage range.

Third, in accordance with the present invention, the variable capacitor circuit having linearity can be applied to a resonant circuit constituting the VCO, thereby obtaining a linear VCO frequency and a constant VCO gain within the whole control voltage range and in turn improving a noise characteristic.

Furthermore, the VCO having the constant gain can be applied to a data recovery, a clock recovery, an RF receiver, an RF transmitter, and a frequency synthesizer, so that a device characteristic can be improved and a high economical efficiency can be attained.

The present application contains subject matter related to Korean patent application No. 2006-0072412, filed with the Korean Intellectual Property Office on Jul. 31, 2006, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A variable capacitor circuit, comprising:
a plurality of variable capacitors being connected in parallel with each other and having different capacitances with respect to an input control voltage,
wherein the sum of the variable capacitances of the plurality of variable capacitors at a same voltage level of the control voltage varied within the whole control voltage range has linearity,
wherein the input control voltage is the only voltage applied to control the variable capacitor circuit,
wherein each of the plurality of variable capacitors are manufactured to have a plurality of capacitances as the control voltage Increases along the whole control voltage range, and
wherein each of the plurality of variable capacitors are manufactured by controlling a doping concentration to enable each of the plurality of capacitors to have different C/V characteristics.

2. The variable capacitor circuit as recited in claim 1, wherein the control voltage generating a capacitance with an intermediate value of each of the plurality of variable capacitors has different voltage levels within the whole control voltage range.

3. The variable capacitor circuit as recited in claim 1, wherein the plurality of variable capacitors have the same capacitance characteristic with respect to a variation of the control voltage.

4. The variable capacitor circuit as recited in claim 1, wherein the plurality of variable capacitors have different capacitance characteristics with respect to a variation of the control voltage.

5. The variable capacitor circuit as recited in claim 1, wherein each of the plurality of variable capacitors is comprised of a junction varactor or a MOS varactor.

6. A voltage controlled oscillator, comprising:
a plurality of variable capacitors being connected in parallel with each other and having different capacitances with respect to an input control voltage; and
an inductor connected in parallel with the variable capacitor circuit,
wherein the sum of the variable capacitances of the plurality of variable capacitors at a same voltage level of the control voltage varied within the whole control voltage range has linearity, wherein the input control voltage is the only voltage applied to control the plurality of variable capacitors of the voltage controlled oscillator, wherein each of the plurality of variable capacitors are manufactured to have a plurality of capacitances as the control voltage increases along the whole control voltage range, and wherein each of the plurality of variable capacitors are manufactured by controlling a doping concentration to enable each of the plurality of capacitors to have different C/V characteristics.

7. The voltage controlled oscillator as recited in claim 6, further comprising an oscillation circuit for amplifying a resonant frequency generated by the variable capacitor circuit and the inductor to generate an oscillation frequency.

8. The variable capacitor circuit as recited in claim 1 further comprises:

generating the plurality of capacitance for each of the plurality of manufactured variable capacitors by controlling a doping concentration of a channel or substrate for each of the plurality of capacitors.

9. The voltage controlled oscillator as recited in claim 6 further comprises:

generating the plurality of capacitance for each of the plurality of manufactured variable capacitors by controlling a doping concentration of a channel or substrate for each of the plurality of capacitors.

* * * * *